United States Patent
Lee

(10) Patent No.: US 8,507,931 B2
(45) Date of Patent: Aug. 13, 2013

(54) LIGHT EMITTING APPARATUS, METHOD OF MANUFACTURING THE SAME, AND LIGHTING SYSTEM

(75) Inventor: Sang Hyuk Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 40 days.

(21) Appl. No.: 12/958,845

(22) Filed: Dec. 2, 2010

(65) Prior Publication Data

US 2011/0133218 A1    Jun. 9, 2011

(30) Foreign Application Priority Data

Dec. 3, 2009  (KR) .................. 10-2009-0119429
Mar. 8, 2010  (KR) .................. 10-2010-0020499

(51) Int. Cl.
  *H01L 33/00* (2010.01)
(52) U.S. Cl.
  USPC .................................... 257/98; 257/E33.067
(58) Field of Classification Search
  USPC .................. 257/98, E33.067, E33.073
  See application file for complete search history.

(56) References Cited

U.S. PATENT DOCUMENTS

| 3,876,900 | A * | 4/1975 | Amatsuka et al. | 313/510 |
| 7,388,232 | B2 * | 6/2008 | Suehiro et al. | 257/98 |
| 2007/0241335 | A1 | 10/2007 | Kwak et al. | 257/70 |
| 2008/0230796 | A1 * | 9/2008 | Ho et al. | 257/98 |
| 2009/0256166 | A1 * | 10/2009 | Koike et al. | 257/98 |
| 2010/0038665 | A1 * | 2/2010 | Sugiura et al. | 257/98 |

FOREIGN PATENT DOCUMENTS

| JP | 2005-216892 | 8/2005 |
| KR | 10-0643919 | 11/2006 |
| KR | 10-2007-0065486 | 6/2007 |
| KR | 10-0726970 | 6/2007 |
| WO | WO 2007/137006 A2 | 11/2007 |
| WO | WO 2008044759 A1 * | 4/2008 |

OTHER PUBLICATIONS

European Search Report dated Jul. 21, 2011 issued in Application No. 10 19 3708.

* cited by examiner

*Primary Examiner* — Shaun Campbell
(74) *Attorney, Agent, or Firm* — KED & Associates, LLP

(57) ABSTRACT

Disclosed are a light emitting apparatus, a method of manufacturing the same, and a lighting system. The light emitting apparatus includes a body, a light emitting device on the body, a conductive member electrically connected with the light emitting device on the body, a resin member surrounding the light emitting device, and an inorganic oxide layer having a refractive index less than a refractive index of the resin member on the resin member.

20 Claims, 13 Drawing Sheets

LIGHT EMITTING APPARATUS, METHOD OF MANUFACTURING THE SAME, AND LIGHTING SYSTEM

CROSS-REFERENCE TO RELATED APPLICATION

The present application claims priority of Korean Patent Applications Nos. 10-2009-0119429 filed on Dec. 3, 2009 and 10-2010-0020499 filed on Mar. 8, 2010, which are hereby incorporated by reference in its entirety.

BACKGROUND

The embodiment relates to a light emitting apparatus, a method of manufacturing the same, and a lighting system.

A light emitting diode (LED) is a semiconductor light emitting device that converts current into light. Recently, the brightness of the LED is increased, so that the LED has been employed as a light source for a display device, a vehicle, or a lighting device. In addition, the LED can represent a white color having superior light efficiency by employing luminescence materials or combining LEDs having various colors.

Meanwhile, the brightness of the LED can be changed according to various conditions such as an active layer structure, a light extraction structure for effectively extracting light to the outside, semiconductor materials used for the LED, a chip size, and the type of molding members surrounding the LED.

SUMMARY

The embodiment provides a light emitting apparatus capable of minimizing light loss when light generated from a light emitting device is output to the outside, a method of manufacturing the same, and a lighting system.

According to the embodiment, the light emitting apparatus includes a body, a light emitting device on the body, a conductive member electrically connected with the light emitting device on the body, a resin member surrounding the light emitting device, and an inorganic oxide layer having a refractive index less than a refractive index of the resin member on the resin member.

According to the embodiment, a lighting system includes a substrate, and a light emitting module including a light emitting apparatus on the substrate. The light emitting apparatus includes a body, a light emitting device on the body, a conductive member electrically connected with the light emitting device on the body, a resin member surrounding the light emitting device, and an inorganic oxide layer having a refractive index less than a refractive index of the resin member on the resin member.

According to the embodiment, through a method of manufacturing a light emitting apparatus, the light emitting apparatus, which includes a body, a light emitting device on the body, a conductive member electrically connected with the light emitting device on the body, a resin member surrounding the light emitting device, and an inorganic oxide layer on the resin member, is manufactured. The inorganic oxide layer is formed by injecting colloidal particles on the resin member.

DETAILED DESCRIPTION OF THE EMBODIMENTS

Figure 1:
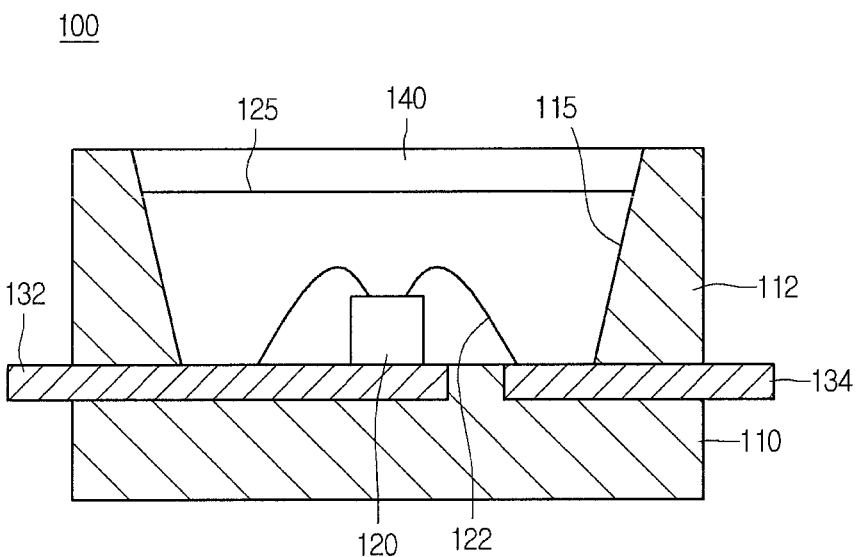
FIG. 1 is a view showing a light emitting device according to a first embodiment.

In the description of the embodiments, it will be understood that, when a layer (or film), a region, a pattern, or a structure is referred to as being "on" or "under" mother substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting apparatus according to embodiments and a method of manufacturing the same, and a lighting system will be described with reference to accompanying drawings.

Embodiment 1

FIG. 1 is a view showing a light emitting apparatus according to a first embodiment.

Referring to FIG. 1, a light emitting apparatus 100 includes a body 110, a light emitting device 120, a resin member 125, first and second conductive members 132 and 134, and an inorganic oxide layer 140.

The body 110 includes one selected from the group consisting of PPA (Polyphthalamide), LCP (Liquid Crystal Polymer), and SPS (Syndiotactic Polystyrene) and is injection-molded in a predetermined shape. However, the body 110 is not limited thereto. A cavity 115 having a cup shape may be formied at a predetermined depth in an upper portion 112 of the body 110. The lateral surfaces of the cavity 115 may be inclined at a predetermined angle about a normal axis to a bottom surface of the cavity 115.

The body 110 includes a plurality of first and second conductive members 132 and 134 provided in a horizontal direction.

The first and second conductive members 132 and 134 are exposed into the cavity 115 while being electrically insulated from teach other. Both end portions of the first and second conductive members 132 and 134 are exposed out of the body 110 and serve as electrodes. Reflective materials may be coated on the surfaces of the first and second conductive members 132 and 134.

The light emitting device 120 may be bonded to the first conductive member 132 through a die-bonding scheme. The light emitting device 120 may be connected to the first and second conductive members 132 and 134 through a wire 122.

The light emitting device 120 includes at least one of color light emitting diodes such as red, green, and blue light emitting diodes, or at least one UV light emitting diode.

The resin member 125 is formed in the area of the cavity 115. The resin member 125 may include transparent silicon or transparent epoxy, or may include luminescence material. A lens may be formed on the resin member 125. In addition, the first and second conductive members 132 and 134 may be electrically connected to a protective device such as a zener diode to protect the light emitting device 120.

The inorganic oxide layer 140 including at least one material having a refractive index between the refractive index of the resin member 125 and the refractive index of external air is formed on the resin member 125. The inorganic oxide layer 140 may be formed in the cavity 115 of the body 110.

Details of the inorganic oxide layer 140 will be described in more detail with reference to FIG. 2.

Figure 2:
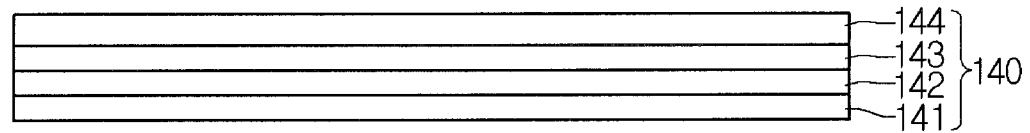
FIG. 2 is a view showing a plurality of inorganic oxide layers constituting an inorganic oxide layer positioned on a resin member according to the disclosure.
Figure 3:
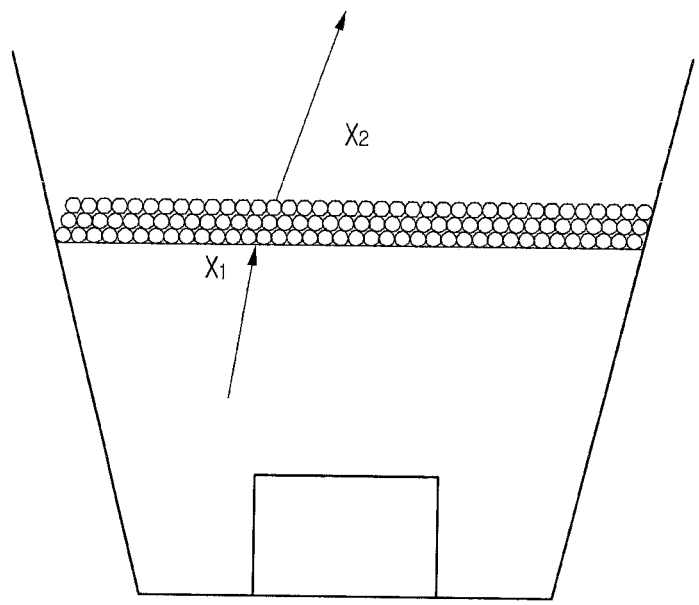
FIGS. 3 and 4 are views showing light refraction of an inorganic oxide layer formed in the light emitting apparatus according to the disclosure.
Figure 4:
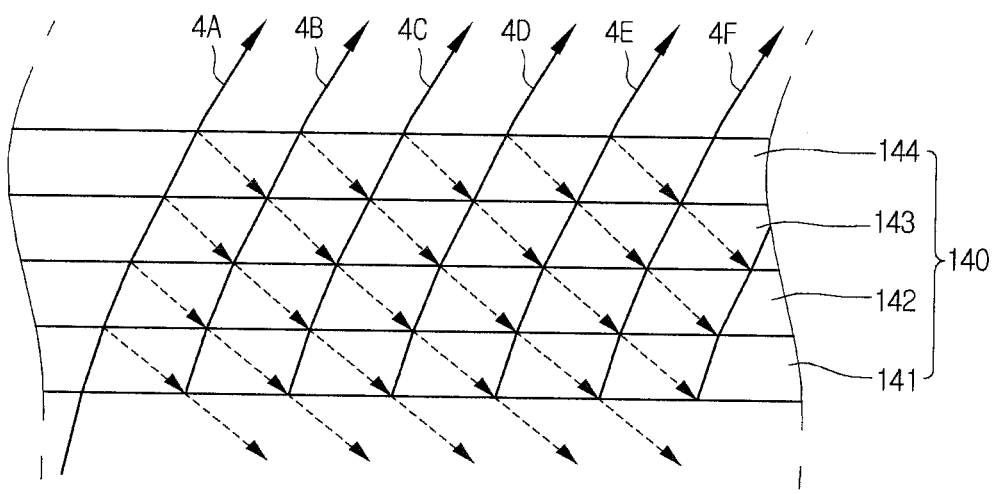

FIG. 2 is a view showing a plurality of inorganic oxide layers constituting the inorganic oxide layer 140 positioned on the resin member 125 according to the disclosure, and FIGS. 3 and 4 are views showing refractive indexes of light of the inorganic oxide layer 140 formed in the light emitting apparatus according to the disclosure.

The inorganic oxide layer 140 includes at least one inorganic oxide layer, and particles constituting the inorganic oxide layer have a colloid size. In addition, preferably, colloidal particles of the inorganic oxide layer include colloidal silica, colloidal titania, colloidal alumina, colloidal zirconia, colloidal vanadia, colloidal chromia, colloidal iron oxide, colloidal antimony oxide, and colloidal tin oxide, and the mixture thereof. The particles of the inorganic oxide layer may include single oxide such as silica or oxide mixtures such as silica and oxide aluminum.

In particular, inorganic oxide layer particles constituting the inorganic oxide layer 140 include nano-size colloidal silica. Preferably, the inorganic oxide layer particles may have an average diameter of about 0.001 μm to about 0.2 μm. In the following description with reference to FIG. 2, silica will be representatively described as an example of particles of the inorganic oxide layers consist ting the inorganic oxide layer 140.

The inorganic oxide layer 140 includes at least one of colloidal silica having different refractive indexes. As shown in drawings, a first sub inorganic oxide layer 141 having a first refractive index, a second sub inorganic oxide layer 142 having a second refractive index, a third sub inorganic oxide layer 143 having a third refractive index, and a fourth sub inorganic oxide layer 144 having a fourth refractive index. Although FIG. 2 shows the inorganic oxide layer 140 including four sub inorganic oxide layers, the inorganic oxide layer 140 may include one sub inorganic oxide layer or more according to the deformations of the embodiment.

For example, if the refractive index of the resin member 125 is 1.5, and the refractive index of the external air is 1.0, the first to fourth sub inorganic oxide layers 141 to 144 include colloidal silica particles having a refractive index less than about 1.5 and greater than about 1.0. In addition, colloidal silica selected from the first to fourth inorganic oxide layers 141 to 144 and closer to the side of air has a less refractive index, so that the difference in the refractive index between the resin member and the air can be reduced.

In other words, the inorganic oxide layer 140 is used to reduce the difference between refractive indexes of media placed on the path of light output to air through the resin member 125. For example, the first sub inorganic oxide layer 141 has a refractive index of about 1.45, the second sub inorganic oxide layer 142 has a refractive index of about 1.38, the third sub inorganic oxide layer 143 has a refractive index of about 1.27, and the fourth sub inorganic oxide layer 144 has a refractive index of about 1.11.

As described above, the first to fourth sub inorganic oxide layers 141 to 144 have reduced refractive indexes as the first to fourth sub inorganic oxide layers 141 to 144 are closer to the external air, that is, further away from the resin member 125.

$$\frac{\sin X2}{\sin X1} = \frac{n1}{n2} \quad \text{[Equation 1]}$$

(n1: the refractive index of medium N1, n2: the refractive index of medium N2, x1: the refraction angle in the medium N1, and x2: the refractive angle in the medium N2).

Equation 1 represents the incidence angle and the refraction angle according to the refractive index of a generally-known medium. It may be understood through Equation 1 that the difference between the incidence angle and the refraction angle is increased as the difference in the refractive index between the resin member 125 and the air is increased, but the difference between the incidence angle and the refractive angle is reduced if material making a less refractive index difference with respect to the air exists on the path of light, so that reflected light can be reduced.

In other words, since the refractive indexes of media existing on a light traveling path gradually approximate the refractive index of air by the inorganic oxide layer 140, light, which is reflected to the light emitting device, is reduced.

Accordingly, as shown in FIG. 4, when light output from the resin member 125 passes through the inorganic oxide layer 140, as shown in reference number 4A, the light can be output to the outside through all of the first to fourth sub inorganic oxide layers 141, 142, 143, and 144 having refractive indexes reduced as they are closer to external air.

Refraction, reflection, and re-reflection are shown with respect to one light path as shown in drawings. Light reflected to the resin member 125 is marked as a dotted line, and light output to the outside through refraction or re-reflection is marked as a solid line.

Finally, light output the light emitting apparatus may travel on the optical paths shown in reference numbers 4A, 4B, 4C, 4D, 4E, and 4F.

Hereinafter, reference numbers 4B and 4C among reference numbers 4A to 4F will be described.

When light is output, although a part of the light is reflected toward the resin member 125 by the inorganic oxide layer 140, light reflected from the second sub inorganic oxide layer 142, the third sub inorganic oxide layer 143, or the fourth sub inorganic oxide layer 144 is re-reflected by the first sub inorganic oxide layer 141, the second sub inorganic oxide layer 142, or the third sub inorganic oxide layer 143 and output to the outside as shown in reference number 4B.

In this regard, as shown in reference number 4C, light re-reflected toward the resin member 125 through the above process may be re-reflected and output to the outside.

The efficiency of light output to the outside can be increased by the inorganic oxide layer 140 having a plurality of layers.

Although the embodiment has been described in that each inorganic oxide constituting the inorganic oxide layer 140 includes colloidal silica, liquid-phase silica is coated in several layers, so that effects similar to that of the colloidal silica can be obtained.

In other words, the first to second sub inorganic oxide layers 141 to 144 shown in FIG. 4 may be hardened after liquid-phase silicon has been coated.

In this case, actually, the sub inorganic oxide layers serving as media may have the same refractive index. However, the quantity of output light may be increased through the refraction, reflection, and re-reflection as shown in reference numbers 4A to 4C.

Light may be reflected toward the light emitting device by the inorganic oxide layer including a plurality of thin film layers. However, the light is re-reflected by another inorganic oxide existing on the reflection path, so that the quantity of light output to the outside can be increased.

Figure 5:
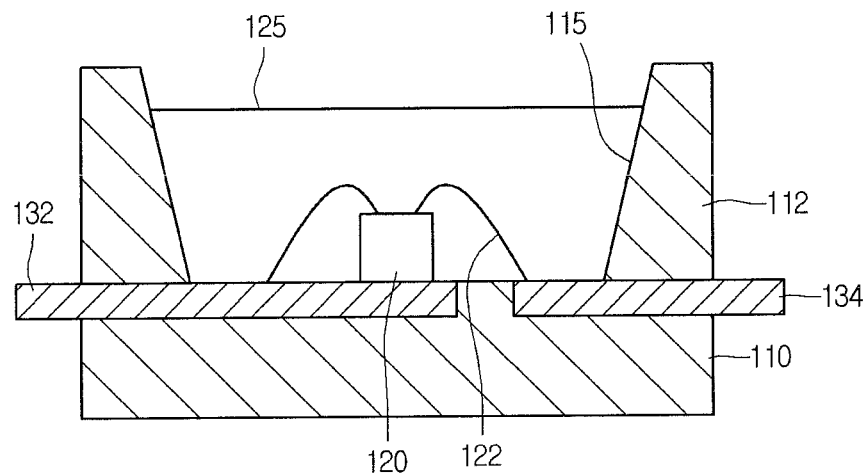
FIGS. 5 to 7 are views showing a method of manufacturing a light emitting apparatus according to a first embodiment.
Figure 6:
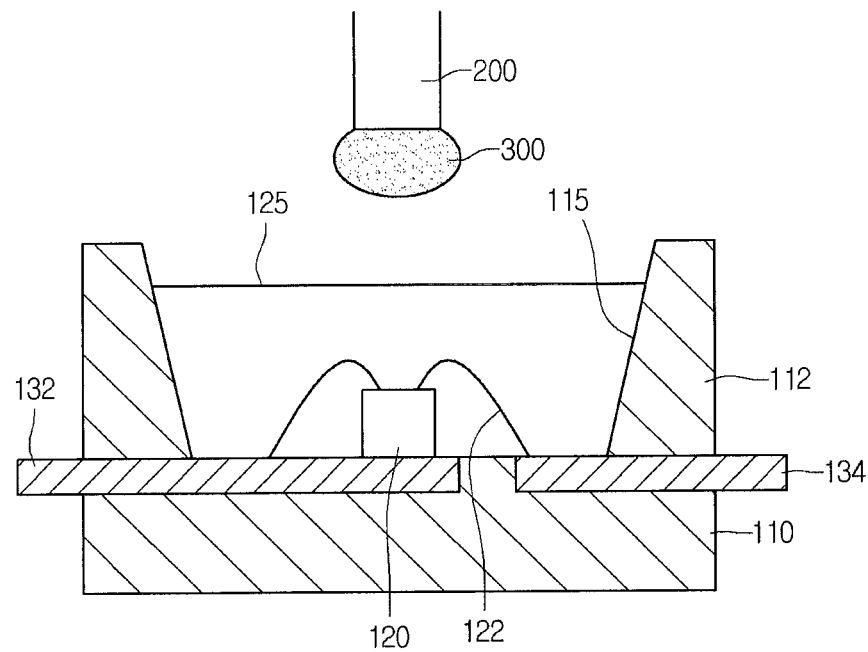
Figure 7:
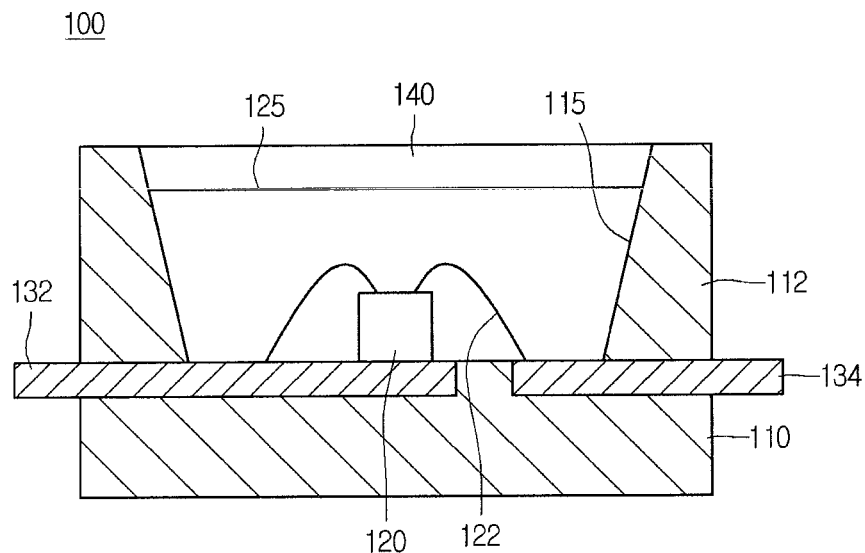

FIGS. 5 to 7 are view showing the method of manufacturing the light emitting apparatus according to the first embodiment.

First, a method of forming the inorganic oxide layer 140 according to the first embodiment in the light emitting apparatus will be described with reference to FIGS. 5 to 7. Such a method may be applied to all of the second to seventh embodiments in the following disclosure.

As shown in FIG. 5, the body 110 is injection molded in such a manner that the cavity 115 is formed by the upper portion 112 of the body 110. The first and second conductive members 132 and 134 that are electrically connected to the light emitting device 120 are formed in the body 110.

Then, the light emitting device 120 is formed on the first conductive member 132, and the resin member 125 containing luminescence material is formed in the cavity 115.

The resin member 125 is formed with the minimum of a thickness capable of preventing the wire 122 connected to the light emitting device 120 from being disconnected. As shown in FIG. 5, the resin member 125 may be not filled in the cavity 115.

Then, as shown in FIG. 6, after colloidal silica 300 has been injected into the cavity 115 of the light emitting apparatus by using an injection rod 200, a printing process is performed. The thickness of the inorganic oxide layer including the colloidal silica 300 may vary an amount of colloidal silica discharged through the injection rod 200 and the pressure to press the end portion of the injection rod 200 on the resin member of the light emitting apparatus.

In the case in which a plurality of colloidal silica layers 300 are formed in the light emitting apparatus, after the colloidal silica 300 has been primarily printed, a hardening process may be performed, and the secondary printing process may be performed.

A plurality of injection rods 200 may be prepared, and colloidal silicas 300 having different refractive indexes may be prepared in the injection rods 200. In this case, the secondary printing may be performed by using the injection rod 200 containing colloidal silica 300 having a refractive index less than that of the colloidal silica 300 hardened after the primary printing has been performed.

After the printing work of the colloidal silica has been finished, the light emitting apparatus has been completely manufactured as shown in FIGS. 1 and 7.

Although the scheme of printing the colloid silica by using the injection rod 200 has been described, liquid-phase silicon may be formed in several layers by using the injection rod 200.

In other words, if liquid-phase silicon is coated on the top surface of the resin member 125, the top surface of the resin member 125 is printed by using the injection rod 200 containing the liquid-phase silicon, and the liquid-phase silicon is hardened. In order to smoothly perform the printing process, a sponge may be additionally provided on the end portion of the injection rod 200 so that liquid-phase material can be printed on the top surface of the resin member.

Hereinafter, a light emitting apparatus according to other embodiments will be described in detail with reference to FIGS. 8 to 19. The same components and structures according to the embodiments will be not described in detail, but only the difference components and structures will be described in detail.

Embodiment 2

Figure 8:
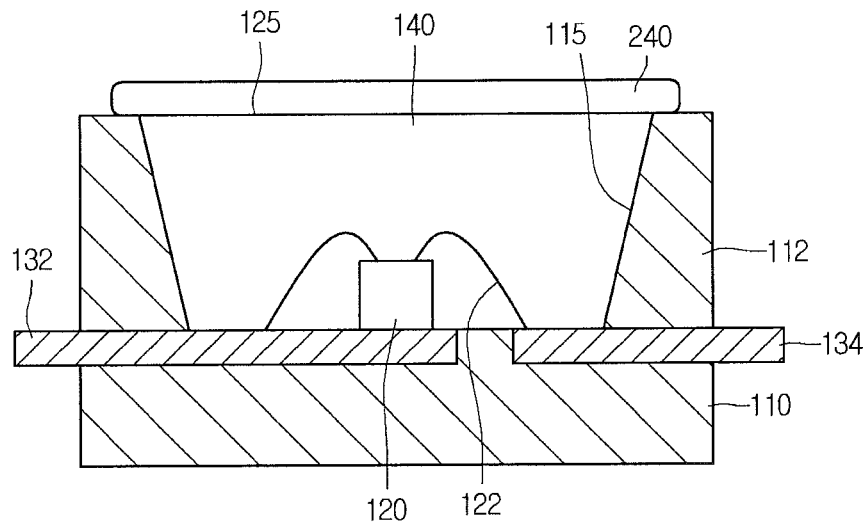
FIG. 8 is a view showing a light emitting apparatus according to a second embodiment.

FIG. 8 is a sectional view showing a light emitting apparatus 100 according to the second embodiment.

Referring to FIG. 8, the light emitting apparatus 100 includes a body 110, the light emitting device 120, the resin member 125, the first and second conductive members 132 and 134, and an inorganic oxide layer 240. The inorganic oxide layer 240 is formed on the resin member 125 and/or the body 110 in the light emitting apparatus 110.

The inorganic oxide layer 240 is formed on the resin member 125 fully filled in the cavity 115, so that at least a part of the inorganic oxide layer 240 may be formed on the surface of the upper portion 112 of the body 110.

Accordingly, the inorganic oxide layer 240 on the upper portion 112 of the body 110 means that the inorganic oxide layer 240 is formed after the light emitting apparatus has been completely manufactured except for the inorganic oxide layer 240.

In order to form the inorganic oxide layer including colloidal silica in the light emitting apparatus according to the disclosure, the inorganic oxide layer may not be formed when the light emitting apparatus is manufactured. Although the light emitting apparatus has been completely manufactured, the inorganic oxide layer may be formed on the resin member of the light emitting apparatus through a printing scheme.

The printing scheme of the inorganic oxide layer has been already described.

Embodiment 3

Figure 9:
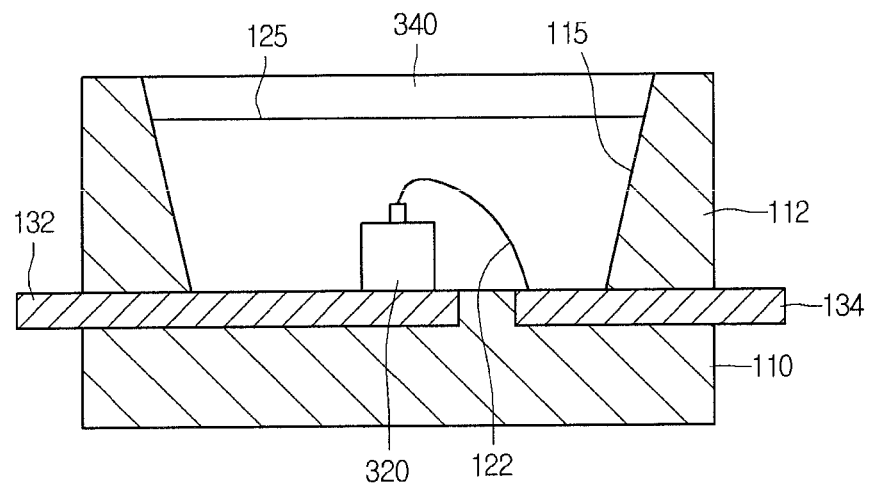
FIG. 9 is a view showing a light emitting apparatus according to a third embodiment.
Figure 10:
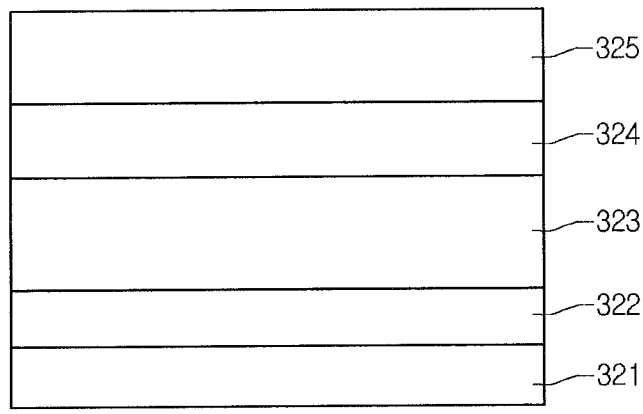
FIG. 10 is a side sectional view showing the light emitting apparatus according to the third embodiment.

FIG. 9 is a view showing a light emitting apparatus according to a third embodiment, and FIG. 10 is a side sectional view showing the light emitting apparatus according to the third embodiment.

A light emitting device shown in FIG. 9 has one wire used to be electrically connected to a conductive member, and the technical spirit of the disclosure may be applicable to the light emitting apparatus including the light emitting device.

Referring to FIG. 9, the light emitting apparatus includes the body 110 having the open upper portion 112 and the cavity 115, the first and second conductive members 132 and 134, a light emitting device 320 electrically connected to the first and second conductive members 132 and 134, and the resin member 125 formed in the cavity 115.

An inorganic oxide layer 340 may be formed on the resin member 125, and may be formed by coating inorganic oxide such as colloidal silica or providing liquid-phase silicon in several layers.

The body 110 may include one selected from the group consisting of silicon, ceramic, and resin. For instance, the body 110 may include at least one selected from the group consisting of silicon, SiC (Silicon Carbide), AlN (Aluminum Nitride), PPA (Polyphthalamide), and LCP (Liquid Crystal Polymer), but the embodiment is not limited thereto.

In addition, the body 110 may be formed as the structure of a single layer substrate or a multi-layer structure, or may be injection-molded, but the embodiment is not limited to the body shape or the body structure.

The cavity 115 having an opening part is formed at the upper portion of the body 110. The surface shape of the cavity 115 may have a concave cup shape or a concave tube shape having a predetermined curvature. The surface shape of the cavity 115 may have a circular shape or a polygonal shape, but the shape may be changed.

The lateral surfaces of the cavity 115 may be inclined with respect to the bottom surface of the body 110 outward, and reflects incident light toward the opening of the cavity 115.

The first and second conductive members 132 and 134 are provided in the body 110 while passing through both sides of the body 110. The first and second conductive members 132 and 134 are provided on the bottom surface of the body 110 and serve as an external electrode. This light emitting apparatus may be a top-view-type light emitting apparatus.

The first and second conductive members 132 and 134 may have the form of a lead frame, the form of a metallic thin film, or the form of a circuit pattern of a printed circuit substrate.

The light emitting device 320 may be bonded to the first conductive member 132 by using a conductive adhesive, and may be electrically connected to the second conductive member 134 by using the wire 122. The light emitting device 320 may be mounted by selectively using a wire bonding scheme, a die bonding scheme, or a flip-bonding scheme, and the bonding scheme may vary according to the type of a chip and the electrode position of the chip.

The light emitting device 320 may selectively include a semiconductor light emitting device manufactured by using a group III and V compound semiconductor such as AlInGaN, InGaN, GaN, GaAs, InGaP, AlInGaP, InP, or InGaAs.

In addition, the light emitting device 320 may include at least one of light emitting diodes such as blue, yellow, green, red, amber, and blue-green light emitting diodes or a UV light emitting diode.

The resin member 125 is formed in the cavity 115. The resin member 125 may include transparent resin materials such as silicon or epoxy. In addition, the surface of the resin member 125 may have a flat shape, a concave shape, or a convex shape, and a lens may be attached to the top surface of the resin member 125.

The resin member 125 may include at least one of luminescence material. The luminescence material may include yellow luminescence material, or include yellow and red luminescence materials.

A rank of the light emitting apparatus may be classified into a chromaticity rank, a luminous intensity rank, and a peak wavelength rank according to the characteristics of light emitted from the light emitting device after the characteristics of the light have been measured.

The light emitting device 320 may be called a vertical-type light emitting device as compared with the light emitting device of the first embodiment or the second embodiment.

Even if the vertical-type light emitting device is formed in the cavity 115, the inorganic oxide layer 340 including colloidal silica according to the disclosure may be formed in the cavity 115, and the resin member 125 formed under the inorganic oxide layer 340 preferably has a thickness corresponding to the extent of preventing the wire 122 connected to the light emitting device 320 from being disconnected.

The vertical-type light emitting device will be described in more detail with reference to FIG. 10.

Referring to FIG. 10, the semiconductor light emitting device 320 includes a conductive support substrate 321, a bonding layer 322, a second conductive semiconductor layer 323, an active layer 324, and a first conductive semiconductor layer 325.

The conductive support substrate 321 may include a metallic substrate or an electrically-conductive semiconductor substrate.

A group III-V nitride semiconductor layer is formed on the substrate 321. The growth equipment of the semiconductor may be selected from the group consisting of E-beam evaporator, PVD (Physical Vapor Deposition), CVD (Chemical Vapor Deposition), PLD (Plasma Laser Deposition), dual-type thermal evaporator, sputtering, and MOCVD (Metal Organic Chemical Vapor Deposition). However, the embodiment is not limited to the above growth equipment.

The bonding layer 322 may be formed on the conductive support substrate 321. The bonding layer 322 bonds the conductive support substrate 321 to the second conductive semiconductor layer 323. In addition, the conductive support substrate 321 may be formed through a plating scheme instead of a bonding scheme. In this case, the bonding layer 322 may not be formed.

The second conductive semiconductor layer 323 is formed on the bonding layer 322, and electrically connected to the first conductive member 132 while making contact with the first conductive member 132.

The second conductive semiconductor layer 323 may include compound semiconductors of group III-V elements doped with the second conductive type dopant. The second semiconductor layer 323 may include a P-type semiconductor layer. For instance, the P-type semiconductor layer may include a semiconductor material having the compositional formula of $In_xAl_yGa_{1-x-y}N$ ($0 \leq x \leq 1$, $0 \leq y \leq 1$, $0 \leq x+y \leq 1$). In detail, the P-type semiconductor layer may include one selected from the group consisting of GaN, AlN, AlGaN, InGaN, InN, InAlGaN, AlInN, AlGaAs, GaP, GaAs, GaAsP, and AlGaInP doped with the P-type dopant such as Mg, Zn, Ca, Sr, or Br.

The second conductive semiconductor layer 323 may include a P type GaN layer having a predetermined thickness formed by supplying gas including a P type dopant such as NH$_3$, TMGa (or TEGa), or Mg.

The second conductive semiconductor layer 323 includes a current spreading structure at a predetermined region. The current spreading structure includes semiconductors having a current spreading speed in a horizontal direction higher than a current spreading speed in a vertical direction.

For instance, the current spreading structure may include semiconductor layers having differences in the concentration and conductivity between dopants.

The second conductive semiconductor layer 323 can supply carriers in a uniform diffusion distribution to an upper layer, for example, the active layer 324.

The active layer 324 is formed on the second conductive semiconductor layer 323. The active layer 324 may include at least one of a single quantum well structure, or a multiple quantum well (MQW) structure. The active layer 324 may include semiconductor material having a compositional formula of In$_x$Al$_y$Ga$_{1-x-y}$N (0≦x≦1, 0≦y≦1, 0≦x+y≦1).

If the active layer 324 has the MQW structure, the active layer 324 may have the stack structure of a plurality of well layers and a plurality of barrier layers. For instance, the well/barrier layer of the active layer 324 may include at least one pair of InGaN/GaN, InGaN/InGaN, GaN/AlGaN, InAlGaN/GaN, GaAs (InGaAs)/AlGaAs, and GaP (InGaP)/AlGaP, but the embodiment is not limited thereto. The well layer may include material having the bandgap energy lower than that of the barrier layer.

A second conductive clad layer (not shown) may be formed between the second conductive semiconductor layer 323 and the active layer 324. The second conductive semiconductor layer 323 may include a P type GaN-based semiconductor. The second conductive clad layer may include material having the bandgap higher than that of the well layer.

The first conductive semiconductor layer 325 may be formed on the active layer 324. The first conductive semiconductor layer 325 may include compound semiconductors of group III-V elements doped with first conductive type dopants. For example, the conductive semiconductor layer 325 may include an N type semiconductor layer. The N type semiconductor layer 325 may include semiconductor materials having the compositional formula of In$_x$Al$_y$Ga$_{1-x-y}$N (0≦x≦1, 0≦y≦1, 0≦x+y≦1) and doped with N type dopants. For example, the N type semiconductor layer may include material selected from the group consisting of GaN, AlN, AlGaN, InGaN, InN, InAlGaN, AlInN, AlGaAs, GaP, GaAs, GaAsP, and AlGaInP doped with an N type dopant such as Si, Ge, Sn, Se, or Te.

The first conductive semiconductor layer 325 may include a N type GaN layer having a predetermined thickness formed by supplying gas including a N type dopant such as NH$_3$, TMGa (or TEGa), and Si.

In addition, the second conductive semiconductor layer 323 may include a P type semiconductor layer and the first conductive semiconductor layer 325 may include an N type semiconductor layer. A light emitting structure may include one of an N—P junction structure, a P—N junction structure, an N—P—N junction structure, and a P—N—P junction structure. Hereinafter, an example in which the first conductive semiconductor layer is provided on the upper most layer of the semiconductor layer will be described for the purpose of explanation about the embodiment.

The first electrode and/or an electrode layer (not shown) may be formed on the first conductive semiconductor layer 325. The electrode layer may include a transmissive layer based on oxide or nitride. For example, the electrode layer may include material selected from the group consisting of ITO (indium tin oxide), ITON (indium tin oxide nitride), IZO (indium zinc oxide), IZON (indium zinc oxide nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, and NiO. The electrode layer may act as a current spreading layer capable of spreading current.

The electrode layer may be a reflective electrode layer. The reflective electrode layer may include a material selected from the group consisting of Ag, Ni, Al, Rh, Pd, Ir, Ru, Mg, Zn, Pt, Au, Hf, and the compound thereof. According to the embodiment, another layer may be further provided on the semiconductor layer in addition to the electrode layer, but the embodiment is not limited thereto. The first electrode may include a metallic layer having a single layer structure or a multiple layer structure. For example, the metallic layer may include at least one selected from the group consisting of Ag, Ag alloy, Ni, Al, Al alloy, Rh, Pd, Ir, Ru, Mg, Zn, Pt, Au, and Hf or the alloy thereof.

Embodiment 4

Figure 11:
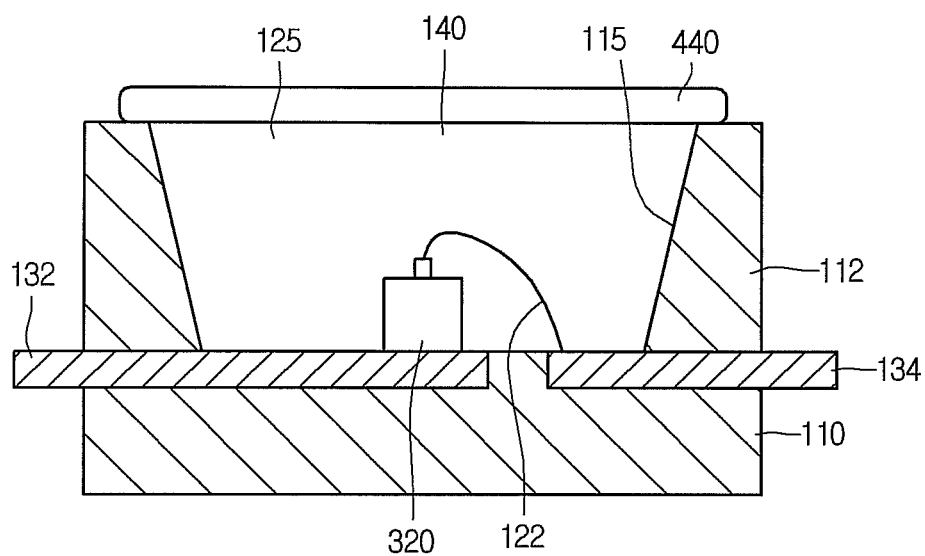
FIG. 11 is a view showing a light emitting apparatus according to a fourth embodiment.

FIG. 11 is a view showing a light emitting apparatus according to a first embodiment.

In the light emitting apparatus shown in FIG. 11, the inorganic oxide layer including colloidal silica according to the disclosure is formed after the light emitting apparatus has been manufactured. In other words, the light emitting apparatus according to the present embodiment makes a difference from the third embodiment shown in FIG. 10 in that an inorganic oxide layer 440 is not only formed on the resin member 125, but on the upper portion 112 of the body 110 of the light emitting apparatus.

In other words, according to the present embodiment, since the resin member 25 is fully filled in the cavity 115, colloidal silicas constituting the inorganic oxide layer 440 may be formed on both of the top surface of the resin member 125 and the upper portion 112 of the body 110.

The colloidal silicas are printed on both of the resin member 125 and the upper portion 112 of the body 110, so that the light emitting apparatus shown in FIG. 11 may be manufactured.

Embodiment 5

Figure 12:
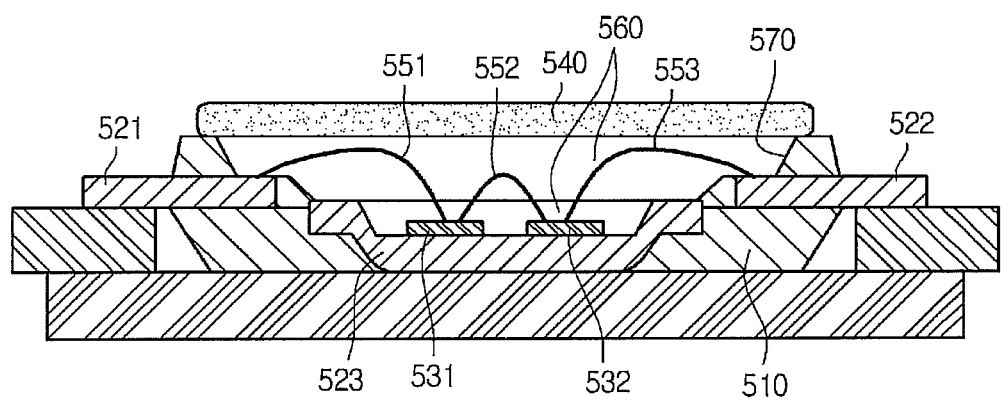
FIGS. 12 and 13 are view showing a light emitting apparatus according to a fifth embodiment.
Figure 13:
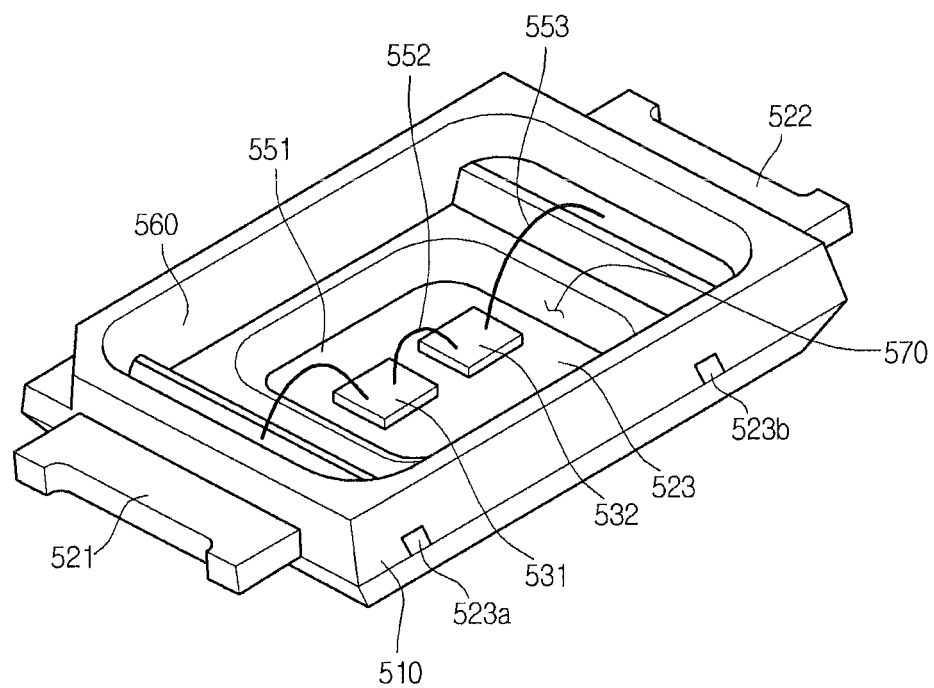

FIGS. 12 and 13 are views showing a light emitting apparatus according to a fifth embodiment.

The light emitting apparatus according to the fifth embodiment includes a plurality of light emitting devices in a cavity. Even if the light emitting device has a generally-known structure, the inorganic oxide layer according to the disclosure may be formed on a resin member. The inorganic oxide layer may include particles such as colloidal silica as disclosed above. In addition, the inorganic oxide layer may be formed by forming multi-layer silicon using liquid-phase silicon according to the deformations of the embodiment, and this coincides with the technical spirit of improving light efficiency.

Hereinafter, an example of a light emitting apparatus having a plurality of light emitting devices will be described with reference to FIGS. 12 and 13.

Referring to FIGS. 12 and 13, the light emitting apparatus according to the fifth embodiment includes a body 510, first to third conductive members 521 to 523 formed on the body 510, first and second light emitting devices 531 and 532 mounted on the third conductive member 523, and a resin member 560 filled in a cavity 570 formed in the body 510.

The body 510 supports the first to third conductive members 521 to 523, provides a space in which the first and second light emitting devices 531 and 532 are installed, and forms the cavity 570 filled with the resin member 560. The body 510 may include resin material, and is injection-molded together with the first to third conductive members 521 to 523.

The first and second conductive members 521 and 522 serve as conductive members to supply power to the first and second light emitting devices 531 and 532. The third conductive member 523 serves as a heat sink to discharge heat emitted from the first and second light emitting devices 531 and 532 while serving as a reflective layer to effectively reflect light emitted from the first and second light emitting devices 531 and 532. The first to third conductive members 521 to 523 include metallic material.

The first and second conductive members 521 and 522 are installed at both sides of the body 510 while passing through the body 510. In other words, parts of the first and second conductive members 521 and 522 are exposed in the cavity 570 of the body 510, and parts of the first and second conductive members 521 and 522 are exposed out of the body 510.

The third conductive member 523 is interposed between the first and second conductive members 521 and 522, and provided lower than the first and second conductive members 521 and 522. The third conductive member 523 may be electrically insulated from the first and second conductive members 521 and 522, or electrically connected to one of the first and second conductive members 521 and 522.

The top surface of the third conductive member 523 forms the bottom surface of the cavity 570, and the bottom surface of the third conductive member 523 is arranged in line with the bottom surface of the body 510.

The top surface of the third conductive member 523 includes a first plane having a first height, a second plane having a second height lower than the first height, and an inclined surface connecting the first and second planes to each other, and the first and second light emitting devices 531 and 532 are provided on the second plane. Although the embodiment has been described in that the first and second light emitting devices 531 and 532 are mounted on the second plane, at least three light emitting devices may be mounted on the second plane. The first and second light emitting devices 531 and 532 may include an LED (light emitting diode).

The first and second light emitting devices 531 and 532 are electrically connected to the first and second conductive members 521 and 522 through a wire.

The first wire 551 electrically connects the first conductive member 521 to a first electrode layer of the first light emitting device 531 with each other, and the second wire 552 electrically connects a second electrode layer of the first light emitting device 531 with the first electrode layer of the second light emitting device 532. The third wire 553 electrically connects the second electrode layer of the second light emitting device 32 with the second conductive member 522.

The resin member 560 including transparent resin material such as silicon resin or epoxy resin is filled in the cavity 570 of the body 510, and may include luminescence materials. The luminescence materials may be uniformly distributed in the resin member 560, or may be formed in only a region adjacent to the first and second light emitting devices 531 and 532.

Third frame connection parts 523a and 523b are exposed through the lateral surfaces of the body 510. The third frame connection parts 523a and 523b support the third conductive member 523 when the body 510 is injection-molded and are removed after the injection molding has been completed.

In the case of the light emitting apparatus having the above structure, the inorganic oxide layer 540 including colloidal silica is formed on the resin member 560, and includes media allowing the light output from the first and second light emitting devices 531 and 532 to be efficiently output upward.

In other words, the light output from the first and second light emitting devices 531 and 532 may undergo media having refractive indexes gradually approximating the refractive index of air as the light travels through the inorganic oxide layer 540, thereby preventing the light from being reflected downward (toward the first and second light emitting devices 531 and 532).

Embodiment 6

Figure 14:
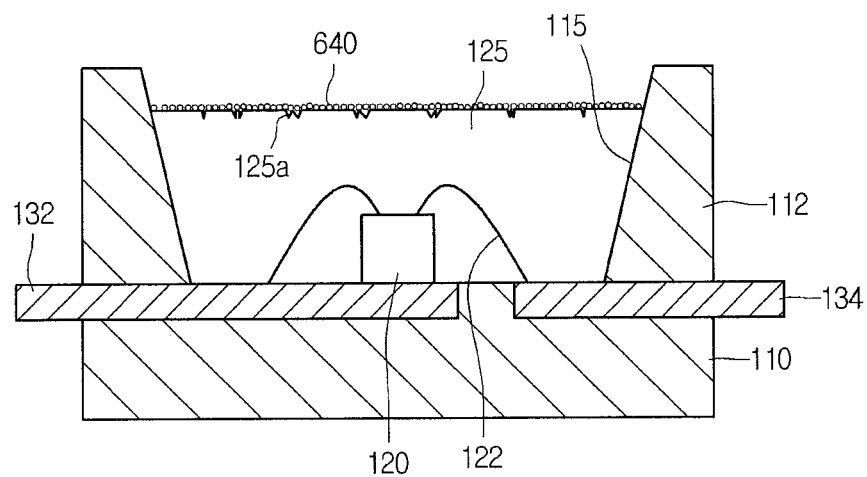
FIG. 14 is a view showing a light emitting apparatus according to a sixth embodiment.
Figure 15:
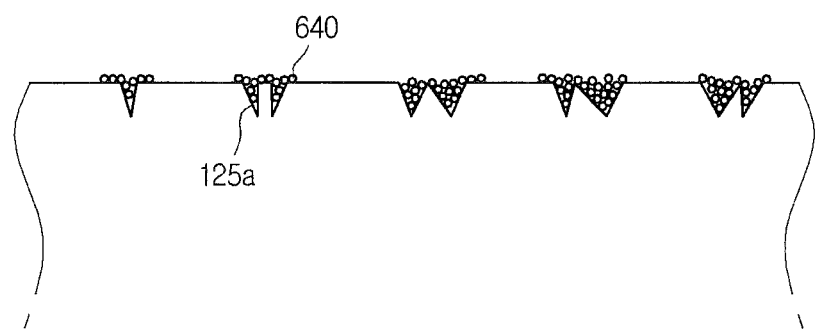
FIG. 15 is a view showing the scratch formed on the surface of the resin member of the light emitting apparatus according to the sixth embodiment and showing that colloidal silica particles is coated in the scratch.

FIG. 14 is a view showing a light emitting apparatus according to a sixth embodiment, and FIG. 15 is a view showing the scratch formed on the surface of the resin member of the light emitting apparatus according to the sixth embodiment and showing that colloidal silica is coated on the scratch.

The light emitting device according to the sixth embodiment of the disclosure in the following description represents the technical spirit applicable to the light emitting devices according to the first to fifth embodiment. The description about the sixth embodiment and related drawings will be made based on the description of the light emitting device according to the first embodiment.

Referring to FIG. 14, the light emitting apparatus 100 includes the body 110, the light emitting device 120, the resin member 125, the first and second conductive members 132 and 134, and an inorganic oxide layer 640.

The inorganic oxide layer 640 may include colloidal silica similarly to those of the previous embodiments.

In particular, a plurality of scratches are formed on the surface of the resin member 125, and colloidal silicas are attached inside a concave part 125a formed due to the scratch.

The inorganic oxide layer 640 including colloidal silica having a refractive index between the refractive index of the resin member 125 and the refractive index of external air is formed on the resin member 125. The inorganic oxide layer 640 may be formed in the cavity 115 of the body 110.

Before the inorganic oxide layer 640 including colloidal silica particles is formed, scratches are formed on the surface of the resin member 125. In other words, a plurality of irregular concave parts are formed on the surface of the resin member 125 to the extent that the wire 122 installed in the cavity 115 is not damaged.

Description about the resin member 125 having irregular scratches or concave parts and the inorganic oxide layer 640 formed on the resin member 125 will be described with reference to FIG. 15.

Before the colloidal silica particles are formed on the resin member 125, a plurality of scratches are applied to the surface of the resin member 125 to form irregular concave parts 125a as shown in FIG. 15.

The concave parts 125a are formed to the extent that the wire 122 in formed in the resin member 125 is not affected by the concave parts 125a.

Then, silica particles are scattered on the resin member 125 having the irregular concave parts 125a, so that the colloidal silicas are placed inside the concave part 125a. The colloidal silica particles are scattered, so that colloidal silicas may be formed on the top surface of the resin member 125.

The light output from the light emitting device 120 may be scattered due to the concave part 125a formed by the scratches, and the scattered light may be directed to the outside of the light emitting device while being refracted by the colloidal silica particles.

Embodiment 7

Figure 16:
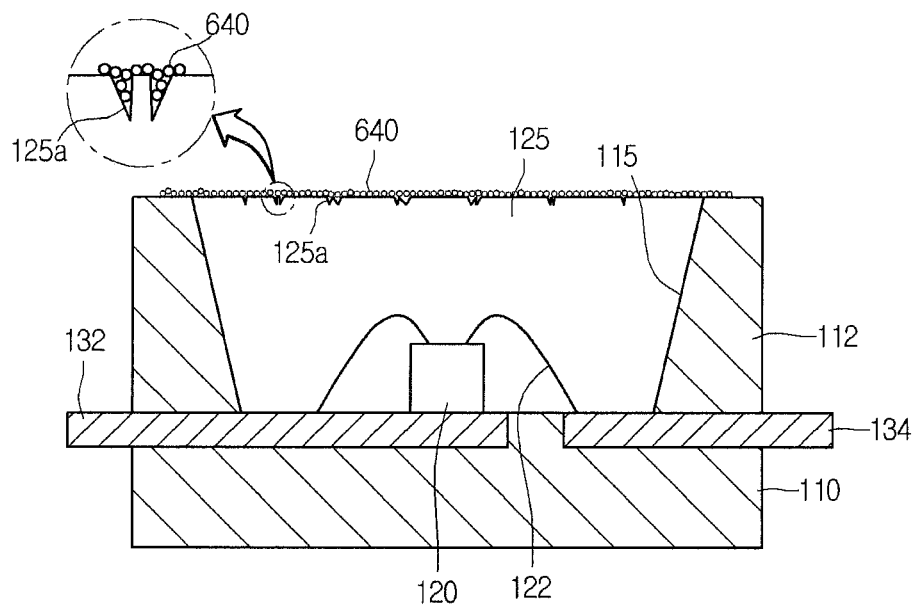
FIG. 16 is a view showing a light emitting apparatus according to a seventh embodiment.

FIG. 16 is a view showing a light emitting apparatus according to a fifth embodiment.

The light emitting apparatus according to the seventh embodiment shown in FIG. 16 has the structure identical to that of the sixth embodiment having irregular concave parts formed on the surface of the resin member except that the colloidal silica particles are formed in the upper portion of the body.

Referring to FIG. 16, the light emitting apparatus 100 includes the body 110, the light emitting device 120, the resin member 125, the first and second conductive members 132 and 134, and the inorganic oxide layer 640. The inorganic oxide layer 640 is formed on the resin member 125 and/or the body 110 in the light emitting apparatus 100 that has been completely manufactured.

The inorganic oxide layer 640 including inorganic oxide material such as colloidal silica having a refractive index between the refractive index of the resin member 125 and the refractive index of external air is formed on the resin member 125. In particular, the inorganic oxide layer 640 is formed on the resin member 125 fully filled in the cavity 115, so that a part of the inorganic oxide layer 640 may be formed on the upper portion 112 of the body 110.

In addition, the irregular concave parts 125a are formed on the surface of the resin member 125 by applying scratches. The colloidal silica particles constituting the inorganic oxide layer 640 are formed inside the concave part 125a, on the top surface of the resin member 125, and the upper portion 112 of the body 110.

The inorganic oxide layer 640 is formed on the upper portion 112 of the body 110 as described above. This is because the inorganic oxide layer 640 is formed after the light emitting apparatus has been completely manufactured except for the inorganic oxide layer 640.

Similarly to the previous embodiments, the inorganic oxide layer 640 may include colloidal silicas, and may include material selected from the group consisting of colloidal titania, colloidal alumina, colloidal zirconia, colloidal vanadia, colloidal chromia, colloidal iron oxide, colloidal antimony oxide, and colloidal tin oxide, and the mixture thereof other than colloidal silicas.

In order to form the inorganic oxide layer including colloidal silica in the light emitting apparatus according to the disclosure, the inorganic oxide layer may be not formed in the manufacturing process of the light emitting apparatus. Although the light emitting apparatus has been completely manufactured, scratches may be applied to the surface of the resin member of the light emitting apparatus in order to form grooves, and silica particles are scattered and formed in the inside of the groove formed by the scratches and the top surface of the resin member.

Embodiment 8

Figure 17:
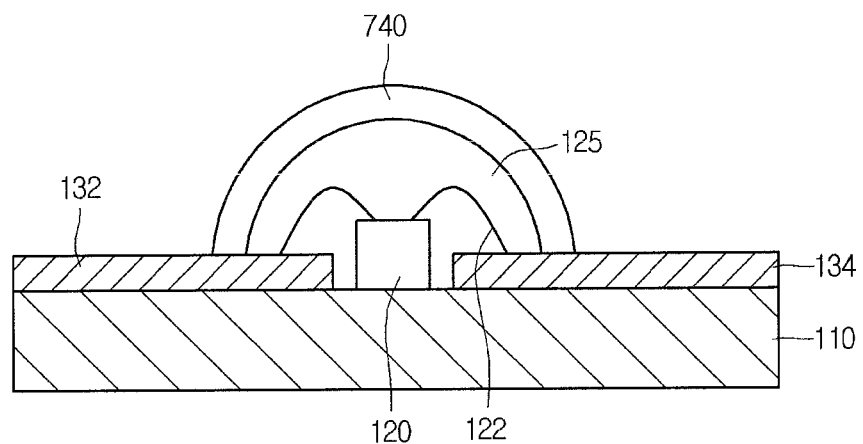
FIG. 17 is a view showing a light emitting apparatus according to an eighth embodiment.

FIG. 17 is a view showing a light emitting apparatus according to an eighth embodiment. Hereinafter, the light emitting apparatus according to the eighth embodiment will be described, and the structures and components identical to those of the previous embodiment will be further not described in order to avoid redundancy.

In the light emitting apparatus according to the eighth embodiment shown in FIG. 17, the first and second conductive members 132 and 134 are formed on the body 110 without the cavity, and the light emitting device 120 is mounted on the body 110. The body 110 may include insulating material.

The light emitting device 120 may be electrically connected to the first and second conductive members 132 and 134 through the wire 122. One wire 122 or two wires 122 may be provided. As another example, the light emitting device 120 may be connected to the first and second conductive members 132 and 134 through a flip-chip scheme.

The resin member 125 may surround the light emitting device 120, and may have a dome shape. In addition, an inorganic oxide layer 740 may be formed on the resin member 125. The top surface of the inorganic oxide layer 740 may have a dome shape according to the shape of the resin member 125.

Embodiment 9

Figure 18:
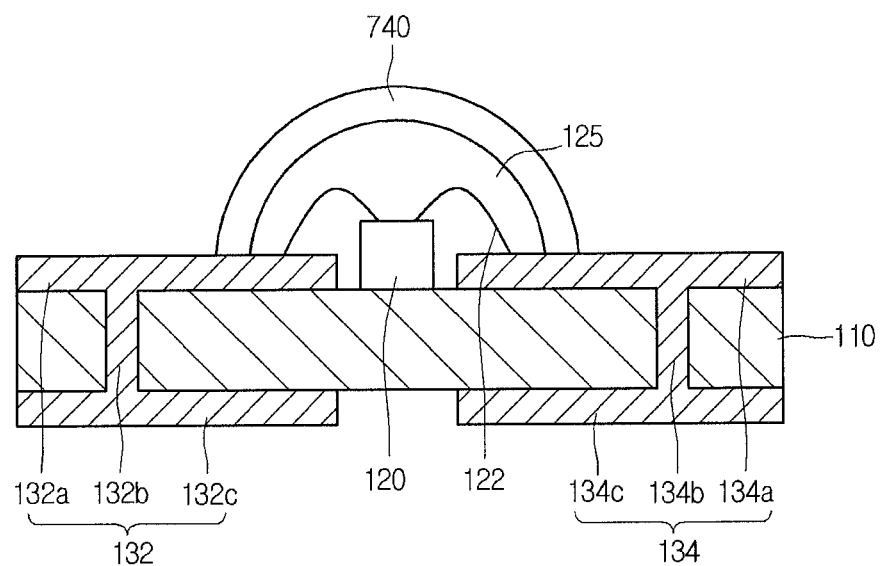
FIG. 18 is a view showing a light emitting apparatus according to a ninth embodiment.

FIG. 18 is a view showing a light emitting apparatus according to a ninth embodiment. Hereinafter, the light emitting apparatus according to the ninth embodiment will be described, and the structures and components identical to those of the previous embodiment will be not further described in order to avoid redundancy.

In the light emitting apparatus according to the ninth embodiment shown in FIG. 18, the first and second conductive members 132 and 134 are formed on the body 110 without the cavity, and the light emitting device 120 is mounted on the body 110. The body 110 may include insulating material.

The first conductive member 132 includes a first upper conductive member 132a formed on the top surface of the body 110, the first lower conductive member 132c formed on the bottom surface of the body 110, and a first conductive via 132b electrically connecting the first upper conductive member 132a with the first lower conductive member 132c while passing through the body 110. In addition, the second conductive member 134 includes a second upper conductive member 134a formed on the top surface of the body 110, a second lower conductive member 134c formed on the bottom surface of the body 110, and a second conductive via 134b electrically connecting the second upper conductive member 134a with the second lower conductive member 134c while passing through the body 110.

The light emitting device 120 is electrically connected to the first and second conductive members 132 and 134 through a wire 122. One wire 122 or two wires 122 may be provided. As another example, the light emitting device 120 may be connected to the first and second conductive members 132 and 134 through a flip-chip scheme.

The resin member 125 may surround the light emitting device 120, and may have a dome shape. In addition, an inorganic oxide layer 740 may be formed on the resin member 125. The top surface of the inorganic oxide layer 740 may have a dome shape according to the shape of the resin member 125.

Embodiment 10

Figure 19:
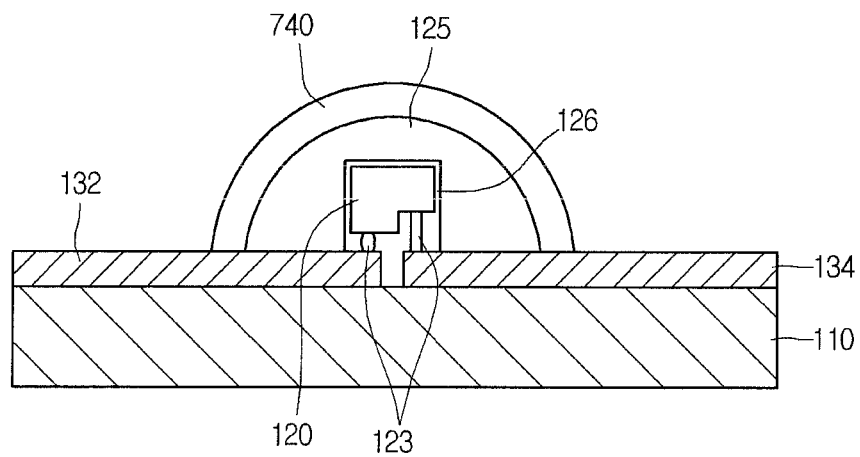
FIG. 19 is a view showing a light emitting apparatus according to a tenth embodiment.

FIG. 19 is a view showing a light emitting apparatus according to a tenth embodiment. Hereinafter, the light emitting apparatus according to the tenth embodiment will be described, and the structures and components identical to those of the previous embodiment will be not further described in order to avoid redundancy.

In the light emitting apparatus according to the tenth embodiment shown in FIG. 19, the first and second conductive members 132 and 134 are formed on the body 110 without the cavity, and the light emitting device 120 is mounted on the body 110. The body 110 may include insulating material.

The light emitting device 120 may be electrically connected to the first and second conductive members 132 and 134 through a flip-chip scheme by using a bump 123.

The resin member 125 may surround the light emitting device 120, and may have a dome shape. A luminescence material layer 126 is formed inside the resin member 125 while surrounding the light emitting device 120. The luminescence material layer 126 may surround the light emitting device 120 at a uniform thickness.

In addition, the inorganic oxide layer 740 may be formed on the resin member 125, and the top surface of the inorganic oxide layer 740 may have a dome shape according to the shape of the top surface of the resin member 125.

Figure 20:
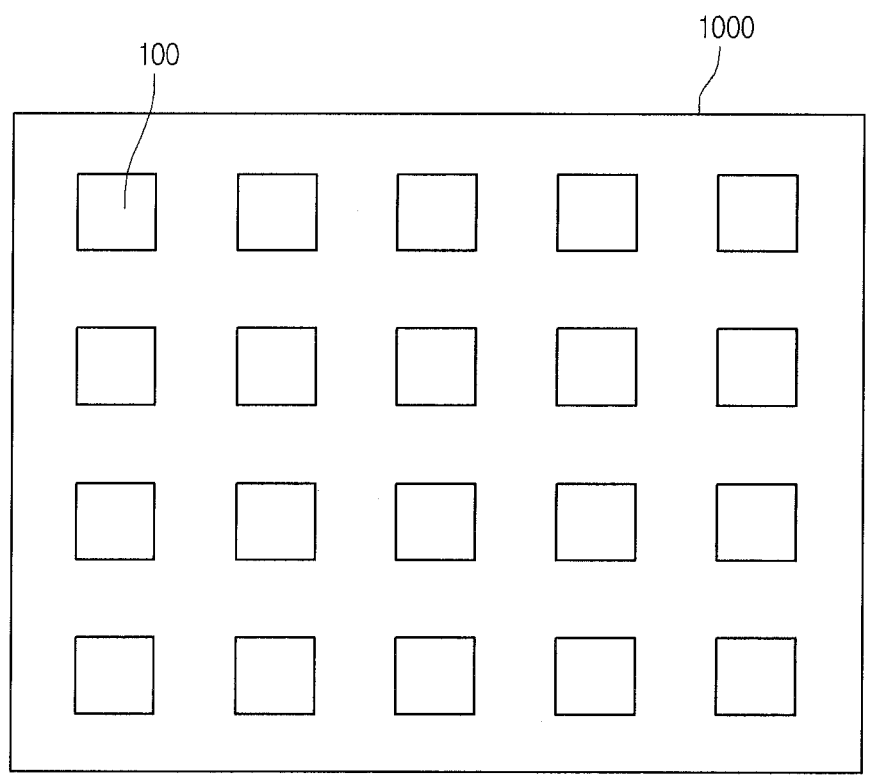
FIGS. 20 and 21 are views showing a scheme of printing colloidal silica with respect to a light emitting apparatus array in which the light emitting apparatuses according to the embodiments are arrayed.
Figure 21:
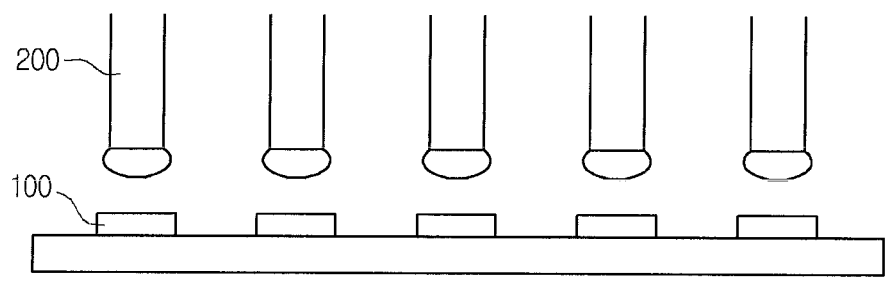

FIGS. 20 and 21 are views showing a scheme of printing colloidal silica with respect to a light emitting apparatus array in which the light emitting apparatuses area according to the embodiments are arrayed.

When the light emitting apparatuses according to the first to tenth embodiments are formed, colloidal silica may be formed on the resin member through the printing scheme shown in FIGS. 20 and 21.

Referring to FIGS. 20 and 21, the light emitting apparatus array 1000, in which the light emitting apparatuses 100 having the resin member formed in the cavity are arrayed, is shown. The light emitting apparatus 100 may be a light emitting apparatus according to several embodiments described above.

The light emitting apparatuses 100 are irregularly arranged on the array substrate. A plurality of injection rods 200 are prepared to inject colloidal silica to each light emitting apparatus 100 of the light emitting apparatus array 1000.

In other words, a plurality of injection rods 200 are prepared corresponding to the light emitting apparatuses arrayed in the light emitting apparatus array 1000, and colloidal silica particles are simultaneously printed on the resin member through the injection rods 200, so that the colloidal silica particles are simultaneously coated on the light emitting apparatuses.

Accordingly, time taken to print colloidal silica on the light emitting apparatuses can be significantly reduced.

In the light emitting apparatus and the method of manufacturing the same according to the embodiment, an inorganic oxide layer having a refractive index less than that of the resin member is formed on the resin member, so that the difference in the refractive index between the resin member and the air can be reduced. Therefore, the light loss caused by the reflection of light at the boundary of the resin member can be reduced, so that the light efficiency of the light emitting apparatus can be improved.

In this case, when the inorganic oxide layer including colloidal silica particles is manufactured, colloidal silica particles can be printed or coated with respect to the array in which a plurality of light emitting apparatuses are arranged. Accordingly, the manufacturing process can be simplified.

Figure 22:
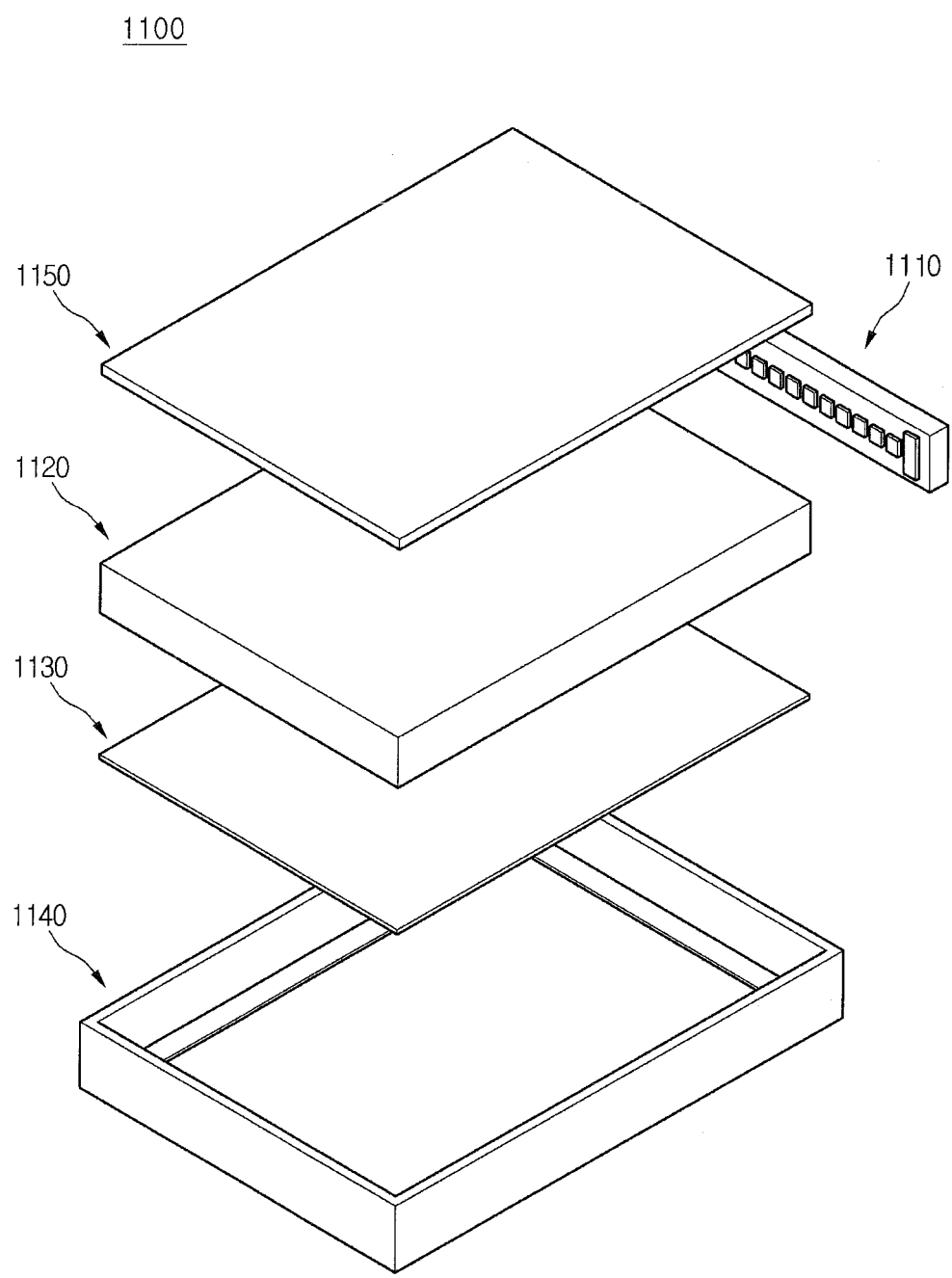
FIG. 22 is a view showing a backlight unit including a light emitting apparatus according to the embodiment.

FIG. 22 is a perspective view showing a backlight unit 1100 including the light emitting apparatus according to the embodiment. The backlight unit 1100 shown in FIG. 22 is an example of a lighting system and the embodiment is not limited thereto.

Referring to FIG. 22, the backlight unit 1100 includes a bottom cover 1140, a light guide member 1120 installed in the bottom cover 1140, and a light emitting module 1110 installed at one side or on the bottom surface of the light guide member 1120. In addition, a reflective sheet 1130 is disposed below the light guide member 1120.

The bottom cover 1140 has a box shape having an open top surface to receive the light guide member 1120, the light emitting module 1110 and the reflective sheet 1130 therein. In addition, the bottom cover 1140 may include metallic material or resin material, but the embodiment is not limited thereto.

The light emitting module 1110 may include a substrate 700 and a plurality of light emitting apparatuses 600 installed on the substrate 700. The light emitting devices 600 provide the light to the light guide member 1120.

As shown in FIG. 22, the light emitting module 1110 is installed on at least one inner side of the bottom cover 1140 to provide the light to at least one side of the light guide member 1120.

In addition, the light emitting module 1110 can be provided below the bottom cover 1140 to provide the light toward the bottom surface of the light guide member 1120. Such an arrangement can be variously changed according to the design of the backlight unit 1100 and the embodiment is not limited thereto.

The light guide member 1120 is installed in the bottom cover 1140. The light guide member 1120 converts the light emitted from the light emitting module 1110 into the surface light to guide the surface light toward a display panel (not shown).

For instance, the light guide member 1120 may include a light guide plate. For instance, the light guide plate may include one selected from the group consisting of acryl-based resin, such as PMMA (polymethyl methacrylate), PET (polyethylene terephthalate), PC (polycarbonate), COC and PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal prism sheet and/or a vertical prism sheet. In addition, the brightness enhancement sheet may include a dual brightness enhancement film and the fluorescent sheet may include a transmittive plate or a transmittive film including luminescent materials.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 23:
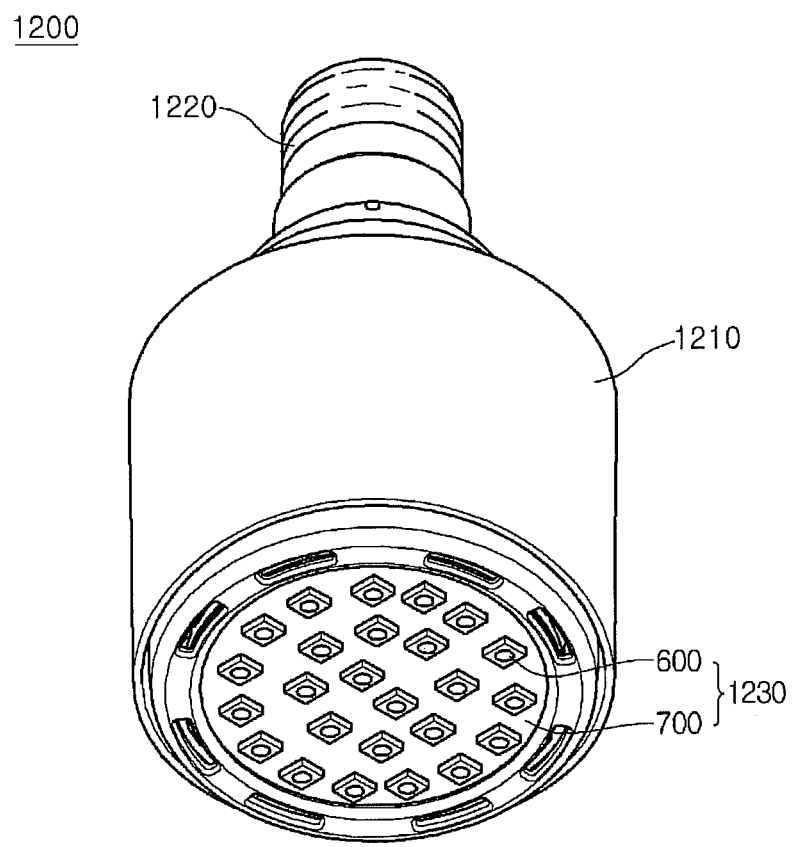
FIG. 23 is a perspective view showing a lighting unit including the light emitting apparatus according to the embodiment.

FIG. 23 is a perspective view showing a lighting unit 1200 including the light emitting apparatus according to the embodiment. The lighting unit 1200 shown in FIG. 23 is an example of a lighting system and the embodiment is not limited thereto.

Referring to FIG. 23, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting apparatus 600 installed on the substrate 700.

The substrate 700 may include an insulating member printed with a circuit pattern. For instance, the substrate 700 includes a PCB (printed circuit board), an MC (metal core) PCB, an F (flexible) PCB, or a ceramic PCB.

In addition, the substrate 700 may include material that effectively reflects the light. The surface of the substrate 700 can be coated with a color, such as a white color or a silver color, to effectively reflect the light.

At least one light emitting apparatus 600 according to the embodiment can be installed on the substrate 700. Each light emitting device 600 may include at least one LED (light emitting diode).

The LEDs of the light emitting module 1230 can be variously combined to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescent materials. In this case, the light emitted from the light emitting module 1230 passes through the fluorescent sheet so that the light is viewed as white light.

to the light emitting module 1230 to supply power to the light emitting module 1230. Referring to FIG. 23, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, since the lighting system according to the present embodiment includes a light emitting apparatus representing a superior light efficiency, the lighting system can represent superior characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
a body;
a light emitting device on the body;
a conductive member electrically connected with the light emitting device on the body;
a resin member provided on the light emitting device, wherein a top surface of the resin member includes a plurality of irregularly shaped scratch marks; and
an inorganic oxide layer provided on the resin member and provided in the plurality of irregularly shaped scratch marks of the resin member, the inorganic oxide layer having a refractive index less than a refractive index of the resin member,
wherein the inorganic oxide layer includes colloidal particles, and the colloidal particles are disposed on the top surface of the resin member and the colloidal particles are provided in the plurality of irregularly shaped scratch marks of the resin member.

2. The light emitting apparatus of claim 1, wherein the inorganic oxide layer includes at least first and second oxide sublayers having refractive indexes different from each other.

3. The light emitting apparatus of claim 2, wherein the first inorganic oxide sublayer is disposed on the resin member, the second inorganic oxide sublayer is disposed on the first inorganic oxide sublayer, and the second inorganic oxide sublayer has a refractive index less than a refractive index of the first inorganic oxide sublayer.

4. The light emitting apparatus of claim 1, wherein the colloidal particles includes colloidal silica particles.

5. The light emitting apparatus of claim 1, wherein the inorganic oxide layer has a refractive index in a range of about 1 to 1.5.

6. The light emitting apparatus of claim 1, wherein the colloidal particles includes colloidal silica particles, and the colloidal silica particles are disposed in the plurality of irregularly shaped scratch marks.

7. The light emitting apparatus of claim 6, wherein the colloidal silica particles are disposed on the body.

8. The light emitting apparatus of claim 1, further comprising a cavity at the body, wherein the light emitting device, the resin member, and the inorganic oxide layer are provided in the cavity.

9. The light emitting apparatus of claim 1, further comprising a cavity at the body, wherein the light emitting device and the resin member are provided in the cavity, and the inorganic oxide layer is disposed on the resin member and the body.

10. The light emitting apparatus of claim 1, wherein the resin member has a dome shape.

11. The light emitting apparatus of claim 1, wherein the light emitting device includes a conductive support substrate, a second conductive semiconductor layer, an active layer, and a first conductive semiconductor layer.

12. A lighting system comprising:
a substrate; and
a light emitting module including a light emitting apparatus on the substrate,
wherein the light emitting apparatus includes a body, a light emitting device on the body, a conductive member electrically connected with the light emitting device on the body, a resin member provided on the light emitting device, and an inorganic oxide layer provided on the resin member, the inorganic oxide layer having a refractive index less than a refractive index of the resin member, wherein the inorganic oxide layer comprises a plurality of sublayers, and wherein the plurality of sublayers comprise at least a first inorganic oxide sublayer and a second inorganic oxide sublayer, and wherein a top surface of the resin member includes a plurality of irregularly shaped scratch marks,
wherein the inorganic oxide layer includes colloidal particles, and the colloidal particles are disposed on the top surface of the resin member and the colloidal particles are provided in each of the plurality of irregularly shaped scratch marks of the resin member.

13. The lighting system of claim 12, wherein each sublayer of the plurality of sublayers has a refractive index different from each other.

14. The lighting system of claim 13, wherein the first inorganic oxide sublayer is disposed on the resin member, the second inorganic oxide sublayer is disposed on the first inorganic oxide sublayer, and the second inorganic oxide sublayer has a refractive index less than a refractive index of the first inorganic oxide sublayer.

15. The lighting system of claim 12, wherein the colloidal particles includes colloidal silica particles, and the colloidal silica particles are disposed in the plurality of irregularly shaped scratch marks.

16. A light emitting apparatus comprising:
a first conductive member that includes a first plane having a first height, a second plane having a second height lower than the first height, and an inclined surface connecting the first plane to the second plane;
a plurality of light emitting devices on the second plane;
a body disposed around the first conductive member, wherein the body includes a cavity, wherein a bottom surface of the body and a bottom surface of the first conductive member are co-planar;
a second conductive member disposed at a first side of the body;
a third conductive member disposed at a second side of the body, wherein the second conductive member, the plurality of light emitting devices and the third conductive member are electrically connected to each other;
a resin member disposed in the cavity, wherein a top surface of the resin member includes a plurality of irregularly shaped scratch marks; and
an inorganic oxide layer on the body and in the plurality of irregularly shaped scratch marks of the resin member, wherein the inorganic oxide layer having a refractive index less than a refractive index of the resin member, and wherein the inorganic oxide layer covers the cavity,
wherein the inorganic oxide layer includes colloidal particles, and the colloidal particles are disposed on the top surface of the resin member and the colloidal particles are provided in the plurality of irregularly shaped scratch marks of the resin member.

17. The light emitting apparatus in claim 16, wherein each of the first, second and third conductive members comprises metallic material.

18. The light emitting apparatus in claim 16, wherein the colloidal particles comprises colloidal silica particles, and the colloidal silica particles are disposed in the plurality of irregularly shaped scratch marks.

19. The light emitting apparatus of claim 1, wherein the inorganic oxide layer is disposed only on an outer surface of the top surface of the resin member.

20. The light emitting apparatus of claim 1, wherein the plurality of irregularly shaped scratch marks are formed only on the top surface of the resin member, and the inorganic oxide layer is directly disposed only on the top surface of the resin member including the plurality of irregularly shaped scratch marks.

* * * * *